(12) United States Patent
Noda et al.

(10) Patent No.: US 8,592,285 B2
(45) Date of Patent: Nov. 26, 2013

(54) METHOD OF BONDING SEMICONDUCTOR SUBSTRATE AND MEMS DEVICE

(75) Inventors: Naoki Noda, Yamanashi (JP); Toshio Yokouchi, Yamanashi (JP); Masahiro Ishimori, Yamanashi (JP)

(73) Assignees: Pioneer Corporation, Kanagawa (JP); Pioneer Micro Technology Corporation, Yamanashi (JP)

( * ) Notice: Subject to any disclaimer, the term of this patent is extended or adjusted under 35 U.S.C. 154(b) by 0 days.

(21) Appl. No.: 13/513,055

(22) PCT Filed: Dec. 11, 2009

(86) PCT No.: PCT/JP2009/006787
§ 371 (c)(1),
(2), (4) Date: Aug. 7, 2012

(87) PCT Pub. No.: WO2011/070626
PCT Pub. Date: Jun. 16, 2011

(65) Prior Publication Data
US 2012/0306032 A1    Dec. 6, 2012

(51) Int. Cl.
*H01L 29/84* (2006.01)
(52) U.S. Cl.
USPC ............ 438/455; 257/415; 257/416; 257/417; 257/421; 257/431
(58) Field of Classification Search
USPC .......................... 438/48, 50, 51, 52, 118, 455
See application file for complete search history.

(56) References Cited

U.S. PATENT DOCUMENTS

| 5,693,574 A | 12/1997 | Schuster et al. |
| 7,442,570 B2 | 10/2008 | Nasiri et al. |
| 2006/0208326 A1* | 9/2006 | Nasiri et al. ................. 257/414 |
| 2009/0050990 A1 | 2/2009 | Aono et al. |
| 2010/0059835 A1* | 3/2010 | Martin et al. ................. 257/417 |
| 2012/0280409 A1* | 11/2012 | Trautmann et al. ........... 257/782 |

FOREIGN PATENT DOCUMENTS

| DE | 102009046687 .8 | * 11/2009 | ............. H01L 23/48 |
| JP | 58-125673 | 7/1983 | |
| JP | 60-191679 | 9/1985 | |
| JP | 61-111789 | 5/1986 | |
| JP | 4-317313 | 11/1992 | |
| JP | 8-1644 | 12/1996 | |
| JP | 2008-177481 | 7/2008 | |

OTHER PUBLICATIONS

International Search Report, PCT/JP2009/006787, Mar. 16, 2010.

* cited by examiner

*Primary Examiner* — Chuong A Luu
*Assistant Examiner* — Rodolfo Fortich
(74) *Attorney, Agent, or Firm* — Young & Thompson

(57) ABSTRACT

A method of bonding a semiconductor substrate has a step of pressurizing and heating to bond a substrate 11 with a substrate 12 by eutectic bonding in a state that an aluminum containing layer 31 and a germanium layer 32 between a bonding section 30a of the substrate 11 and a bonding section 30b of the substrate 21 are overlaid and an outer end 32a of the germanium layer 32 is receded inward with respect to an outer end 31a of the aluminum containing layer 31.

19 Claims, 9 Drawing Sheets

FIG. 4

| Ge FILM THICKNESS-Al FILM THICKNESS | Ge(wt%) | SEALING RATIO | SHEAR STRENGTH(N) |
|---|---|---|---|
| 100nm-800nm | 20% | 0% | 0 |
| 200nm-800nm | 33% | 100% | 56.3 |
| 300nm-800nm | 42% | 100% | 41.6 |
| 400nm-800nm | 45% | 80% | 40.5 |
| 500nm-800nm | 66% | 0% | 18.8 |

F I G. 5A
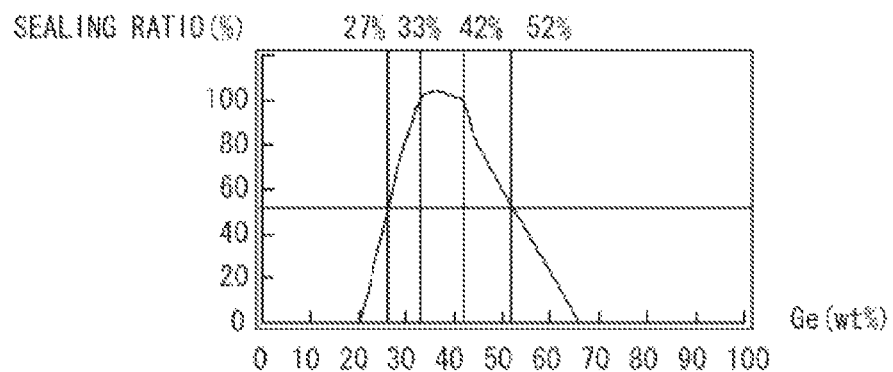
F I G. 5B
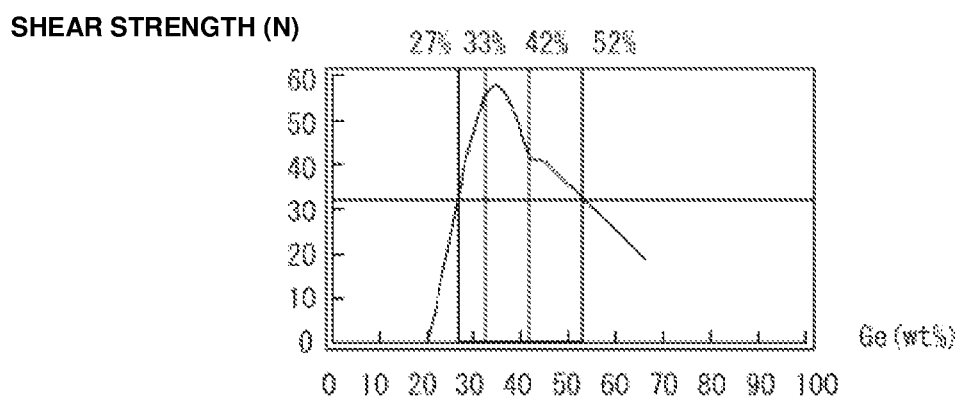

F I G. 9A
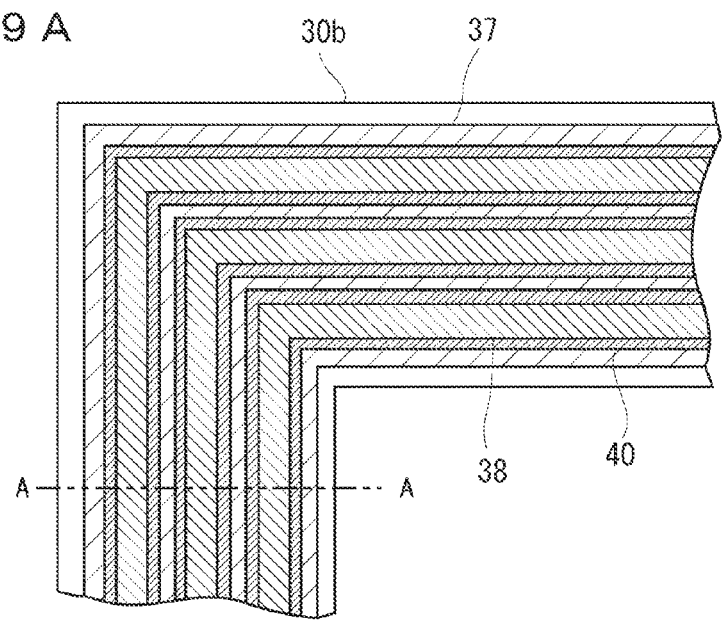
F I G. 9B
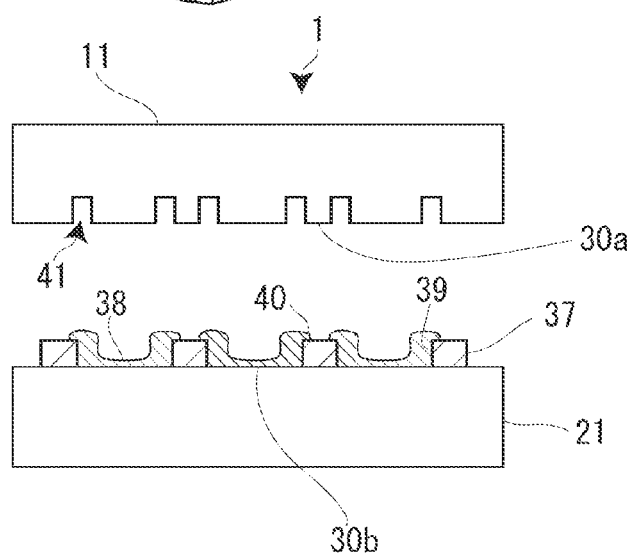
F I G. 9C
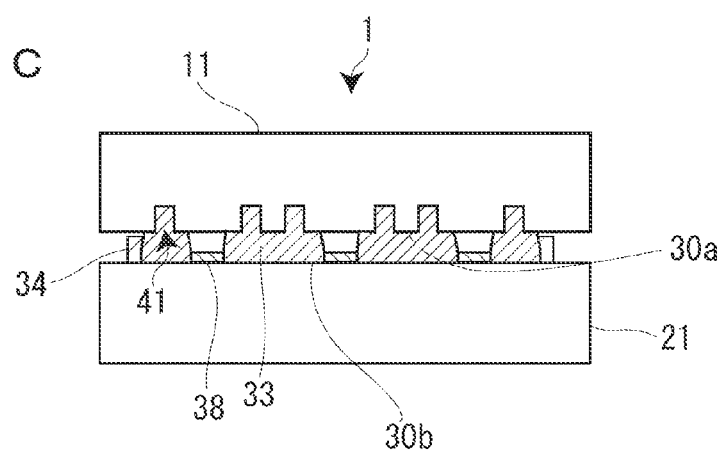

METHOD OF BONDING SEMICONDUCTOR SUBSTRATE AND MEMS DEVICE

TECHNICAL FIELD

The invention relates to a method of bonding by eutectic bonding of two semiconductor substrates and a MEMS device formed by the same.

BACKGROUND ART

As a bonding method of these kinds of semiconductor substrates, a method has been known in which a silicon wafer formed with a MEMS structure has a germanium layer and a silicon wafer formed with integrated circuits has an aluminum containing layer, the germanium layer and the aluminum containing layer are faced to each other to be pressurized and heated, and an eutectic alloy made of the germanium and aluminum fixed to each other is formed (Patent Document 1).
[Patent Document 1] U.S. Pat. No. 7,442,570

DISCLOSURE OF THE INVENTION

Problems that the Invention is to Solve

In such a bonding method, in a case that the germanium layer and the aluminum containing layer are film-formed on a whole bonding surface of the semiconductor substrates, the eutectic alloy made of the germanium and the aluminum might be formed to be pressed out from the bonding surface by the pressurization. In other words, in this case, the eutectic alloy formed to be pressed out might be conducted to an electrode formed around the bonding surface of the semiconductor substrate, and there arises a problem such that a device is defective, making productivity lower.

In view of the foregoing problem, it is an object of the invention to provide a method of bonding a semiconductor substrate without letting an eutectic alloy press out from a bonding surface in eutectic bonding and to provide a MEMS device formed by the same.

Means for Solving the Problems

According to one aspect of the invention, there is provided a method of bonding a semiconductor substrate in which a first semiconductor substrate is bonded with a second semiconductor substrate by eutectic bonding with pressurization and heating, an aluminum containing layer primarily made of aluminum and a germanium layer in an overlaid state being interposed between a bonding surface of the first semiconductor substrate and a bonding surface of the second semiconductor substrate. The method has a step of receding an outer end of the germanium layer inward with respect to an outer end of the aluminum containing layer as to the aluminum containing layer and the germanium layer in the overlaid state.

According to the structure above, since the outer end of the germanium layer is receded inward with respect to the outer end of the aluminum containing layer, a formed eutectic alloy does not protrude from the bonding surface even if the eutectic alloy in a melting state by the pressurization spreads to an outside. Therefore, undesirable conduction to an electrode can be avoided and productivity of the device can be improved. The length from the outer end of the aluminum containing layer to the receded outer end of the germanium layer is preferably equal to or less than 20 μm. Further, the aluminum containing layer and the germanium layer may be film-formed on either the first semiconductor substrate or the second semiconductor substrate. Still further, the aluminum containing layer and the germanium layer may be film-formed on a bonding surface of a same semiconductor substrate or on bonding surfaces of different semiconductor substrates.

In this case, it is preferable that heating temperature and heating time of the pressurization and heating be controlled for alloying the germanium layer and the aluminum containing layer by eutectic bonding except an outer end portion of the aluminum containing layer.

According to the structure above, it is possible to control an area where the eutectic alloy is formed accurately, and to efficiently avoid that the formed eutectic alloy protrudes from the substrates.

In these cases, it is preferable that the aluminum containing layer and the germanium layer be film-formed on either the first semiconductor substrate or the second semiconductor substrate.

According to the structure above, since a metal film does not need to be film-formed on the other semiconductor substrate, a film formation process before bonding the semiconductor substrate can be omitted, thereby a bonding process can be simplified.

In this case, it is preferable that the aluminum containing layer be film-formed in a ring shape in planar view as having predetermined width, and the germanium layer have one or more strip layer sections film-formed in a ring shape in planar view on the aluminum containing layer.

According to the structure above, since the eutectic alloy is formed consecutively in a direction orthogonal to an inner/outer direction of the semiconductor substrate, it is possible to bond the semiconductor substrate with high sealing characteristics.

Further in this case, it is preferable that the aluminum containing layer be film-formed in a ring shape in planar view as having predetermined width, and the germanium layer have a strip layer section film-formed in a ring shape in planar view and a plurality of branch layer sections branched from the strip layer section on the aluminum containing layer.

According to the structure above, since a total extension of a contact end of the germanium layer to the aluminum containing layer can be longer, the eutectic alloy formed by the heating and pressurization tends to fix on the first semiconductor substrate and bonding with high bonding strength can be performed.

In these cases, it is preferable that the aluminum containing layer and the germanium layer be film-formed on the second semiconductor substrate and a pit be formed on the bonding surface of the first semiconductor substrate, in which a eutectic alloy generated by the pressurization and heating fills.

According to the structure above, the eutectic alloy in the melting state formed in a vacuum by the heating and the pressurization fills in the pit by capillary phenomenon. This leads the eutectic alloy to spread in the pit thoroughly, thereby, since the eutectic alloy layer is formed to bite in the first semiconductor substrate, bonding strength of the bonding section can be increased. The pit formed in the first semiconductor substrate may be a plurality of apertures formed intermittently or a slit-like groove formed consecutively.

According to the other aspect of the invention, there is provided a MEMS device bonded by the above bonding method of the semiconductor substrate. The first semiconductor substrate has a MEMS structure formed to be engraved at the bonding surface side thereof, and the second semiconductor substrate has an integrated circuit formed at the bonding surface side to control the MEMS structure.

According to the structure, the substrates are bonded to avoid conduction to an undesired electrode, electric conducts of the MEMS structure, the integrated circuit and an outer circuit are maintained, and the MEMS structure and the integrated circuit are packaged integrally to protect against an outer environment such as moisture, temperature, dust and the like. Therefore, it is possible to provide a MEMS device having high precision.

Further in this case, it is preferable that the MEMS sensor above is either one of an acceleration sensor, an angular velocity sensor, an infrared ray sensor, a pressure sensor, a magnetic sensor and a sonic sensor.

According to the structure above, with the efficient package, it is possible to provide the acceleration sensor, the angular velocity sensor, the infrared ray sensor, the pressure sensor, the magnetic sensor and the sonic sensor having high precision.

BRIEF DESCRIPTION OF THE DRAWINGS

FIG. 4 is a table describing film thickness of the aluminum containing layer and the germanium layer, a weight ratio of the germanium layer to the aluminum containing layer, and numeric values of a sealing ratio and shear strength (bonding strength) of a bonding section.

FIGS. 5A and 5B are graphs illustrating relationships among a weight ratio of the germanium layer to the aluminum layer, the sealing ratio and the shear strength of the bonding section after eutectic bonding.

FIG. 9A is an elevation view and FIGS. 9B and 9C are cross sectional views illustrating film formation arrangement of the aluminum containing layer and the germanium layer according to the other embodiment.

DESCRIPTION OF EXEMPLARY EMBODIMENTS

Referring to the accompanying drawings, a method of bonding a semiconductor and a MEMS device according to one embodiment of the invention will be explained. In the method of bonding a semiconductor substrate according to the embodiment, a MEMS wafer having a number of sensing sections is faced to a CMOS wafer having a number of integrated circuits each of which controls each sensing section to bond by eutectic bonding via metal. In other words, in the invention, the formed MEMS sensor and the integrated circuits are formed in separate processes to face each other and are bonded by eutectic bonding. In the eutectic bonding, a wafer level package technology (WLP technology) is used, by which wafers are sealed collectively as they are, and then are cut off into each chip.

A MEMS device according to the embodiment is fabricated by such eutectic bonding, and, for example, may be conceived as an acceleration sensor, an angular velocity sensor, an infrared ray sensor, a pressure sensor, a magnetic sensor and a sonic sensor.

Figure 1A:
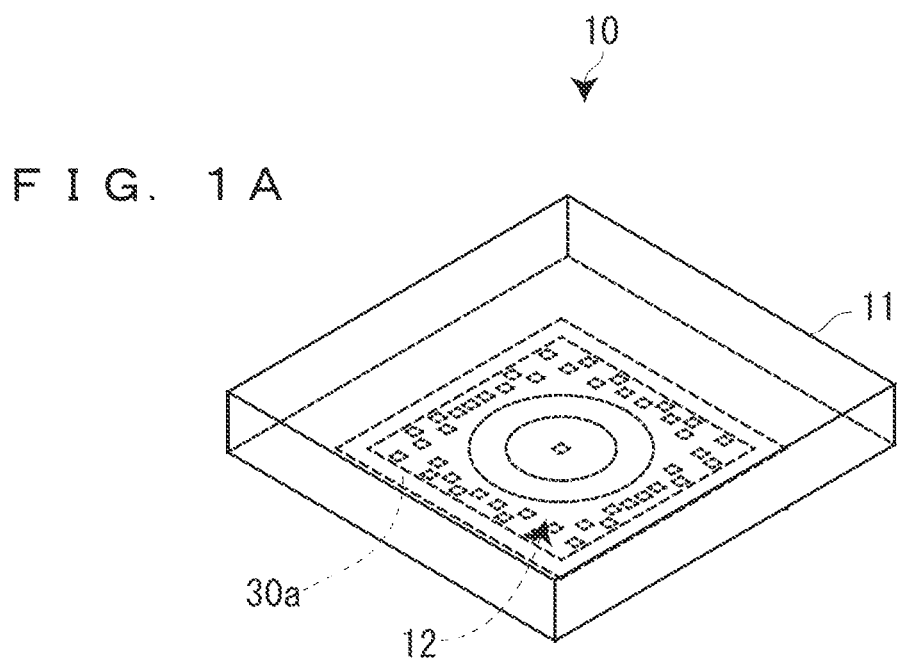
FIGS. 1A and 1B are schematic appearance perspective views of a MEMS chip and a CMOS chip according to an embodiment.

FIG. 1A illustrates a piece in close-up of MEMS wafers (not illustrated) in which a plurality of sensing sections 12 are formed in a matrix shape. Hereinafter, a MEMS chip 10 as the piece will be explained for convenience.

As illustrated, the MEMS chip 10 has a substrate 11 made of Silicon (Si) and a sensing section 12 formed at a center of the substrate 11 by micro fabrication technology. The sensing section 12 is formed to be engraved at the center of the substrate 11 and is composed of elements of an acceleration sensor, an angular velocity sensor, an infrared ray sensor, a pressure sensor, a magnetic sensor, a sonic sensor or the like. Further, the substrate 11 has a ring-shaped bonding section 30a in a planar view which surrounds the sensing section 12. In the MEMS chip 10 in the embodiment, the sensing section 12 and the bonding section 30a are turned over to be upside down to face the CMOS chip 20 described later and the MEMS chip 10 is bonded with the CMOS chip 20. Then, the bonding section 30a of the MEMS chip 10 is confronted with a bonding section 30b formed in the CMOS chip 20, and both are bonded by eutectic bonding via a metal layer film-formed on the bonding section 30b. The substrate 11 corresponds to a first semiconductor substrate and the sensing section 12 corresponds to a MEMS structure in claims.

Figure 1B:
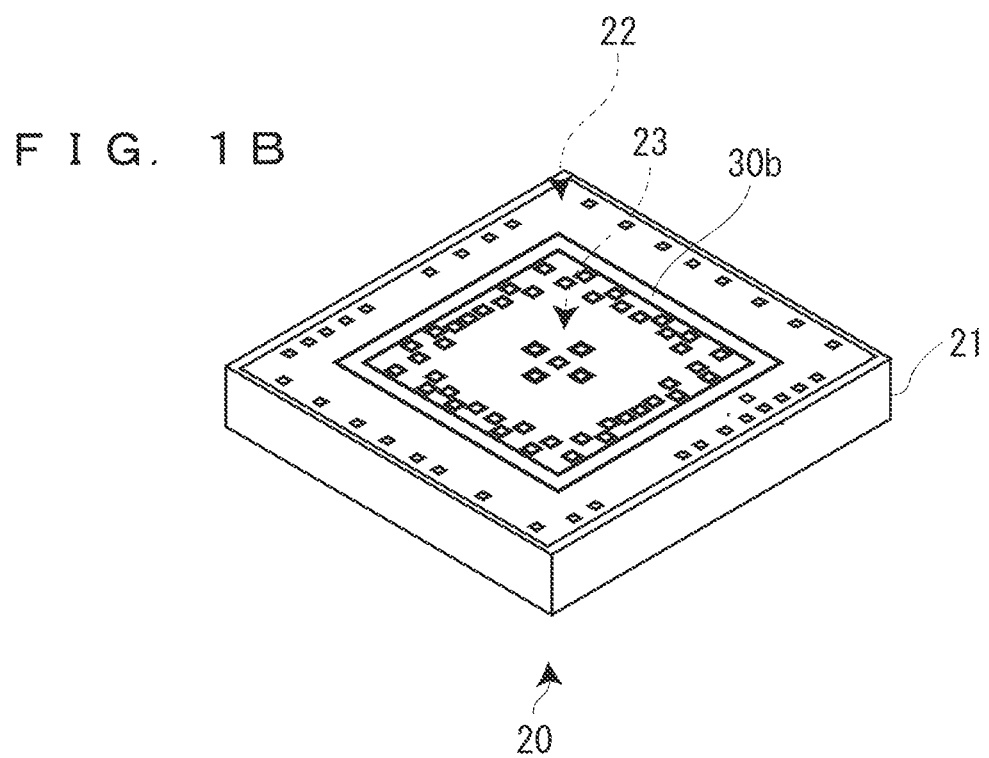

FIG. 1B illustrates apiece in close-up from a CMOS wafer (not illustrated) in which a plurality of integrated circuits 22 are formed in a matrix shape. The CMOS chip 20 as the piece, similar to the MEMS chip 10, will be explained. The CMOS chip 20 has a substrate 21 made of silicon and the integrated circuit formed by micro fabrication technology (semiconductor fabrication technology) on the substrate 21. Further, the ring-shaped bonding section 30b in a planar view is disposed to surround a circuit central section 23 of the integrated circuit 22 facing the sensing section 12 of the MEMS chip 10 at the time of eutectic bonding. The integrated circuit 22 controls the sensing section 12 of the MEMS chip 10 and is connected to input/output signal lines from an outside.

Further, the integrated circuit 22 has aluminum wirings, and an aluminum containing layer 31 film-formed at the time of aluminum wiring formation becomes a part of an eutectic alloy at the bonding. In other words, the bonding section 30b of the CMOS chip 20 is formed in a same shape approximately in a planar view with the bonding section 30a of the MEMS chip 10. At the bonding section 30b of the CMOS chip 20, the aluminum containing layer 31 as the eutectic alloy is film-formed on the substrate 11 and a germanium layer 32 as the eutectic alloy is film-formed on the aluminum containing layer 31 (for example, film formation by sputtering or vapor deposition technology). The substrate 21 corresponds to a second semiconductor substrate and the bonding section 30b corresponds to a bonding section of the second semiconductor substrate.

Figure 2:
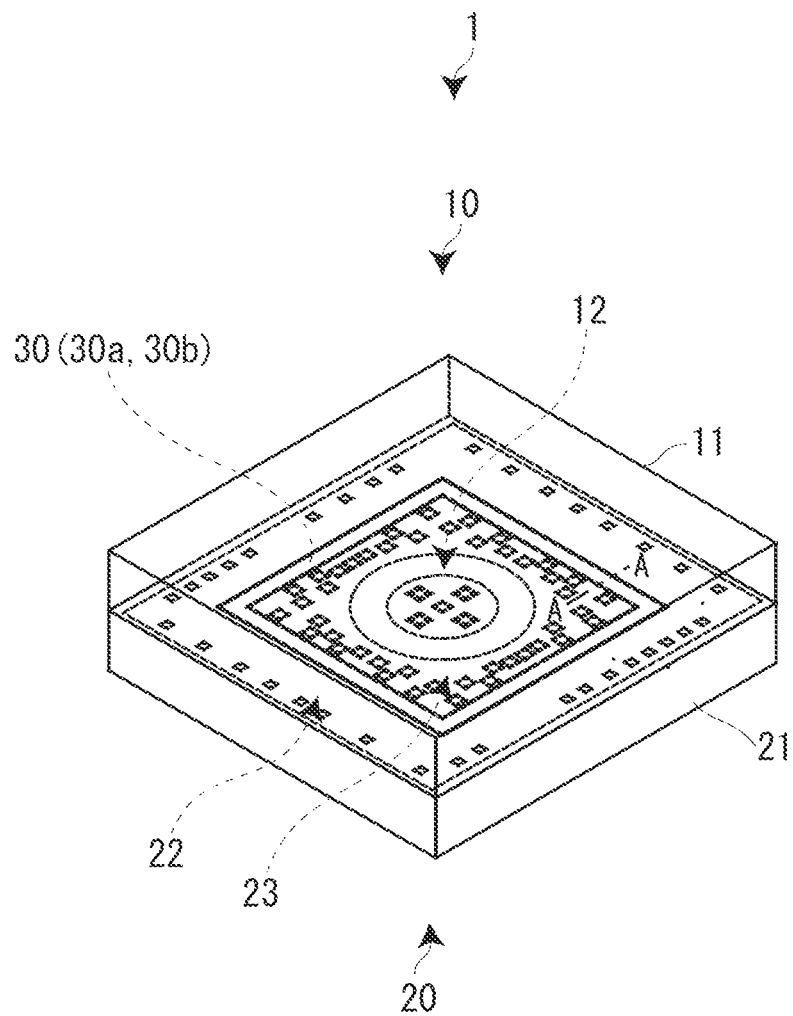
FIG. 2 is a schematic perspective view of a MEMS device according to the embodiment.

FIG. 2 illustrates a MEMS device 1 formed by dicing or breaking the MEMS wafer and the CMOS wafer after the bonding (lamination bonding). As illustrated, the MEMS device 1 is made up of the bonded MEMS chip 10 and the CMOS chip 20 such that the sensing section 12 faces the circuit central section 23.

At the time of bonding, the MEMS chip 10 (MEMS wafer) and the CMOS chip 20 (CMOS wafer) are confronted, are heated from both sides, that is, from the MEMS chip 10 side and the CMOS chip 20 side under vacuum environment and are pressurized from the MEMS chip 10 side. Thus, the germanium layer film-formed at the bonding section 30b of the CMOS chip 20 develops eutectic reaction at a boundary surface with the aluminum containing layer 31, and an aluminum-germanium alloy (hereinafter, refereed as eutectic alloy) is formed. Especially, the eutectic alloy in a melting state is pressed against a silicon surface of the bonding section 30a to be welded by the pressurization from the MEMS chip 10 side, and then, is fixed to be bonded solidly. Further, the eutectic bonding achieves electrical conduction between the substrates 11 and 21 and high sealing characteristics. Heating temperature at the time of bonding is preferably around 450° C. in consideration of heating damage to the sensing section 12 and the integrated circuit 22. Further, the pressurization at the time of bonding may be performed from CMOS chip 20 side or from both the MEMS chip 10 side and the CMOS chip 20 side. Then, after the bonding, an individual MEMS device 1 is fabricated through separation process from a wafer to each chip.

Figure 3A:
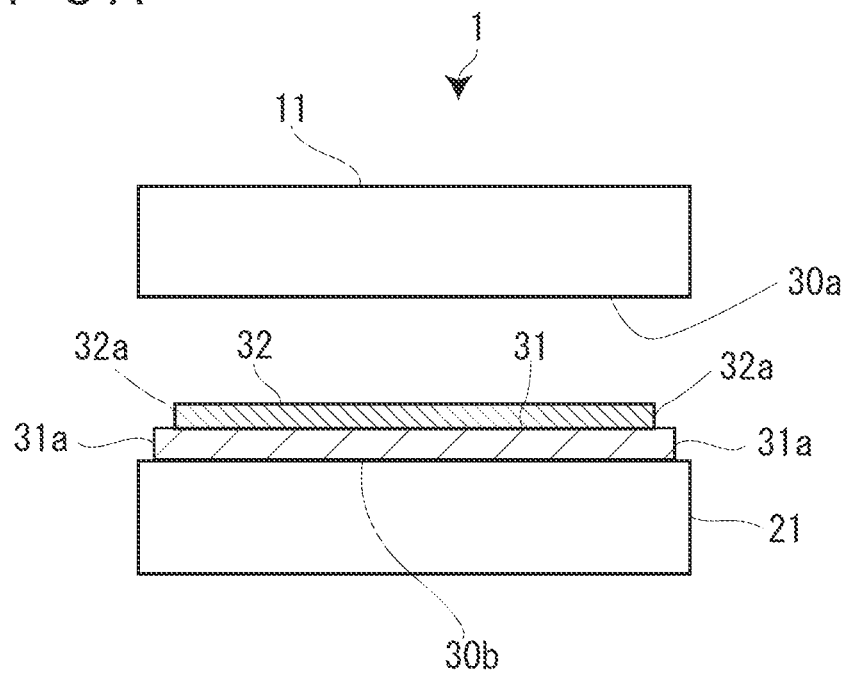
FIGS. 3A and 3B are cross sectional views illustrating film formation arrangement of an aluminum containing layer and a germanium layer according to the embodiment.
Figure 3B:
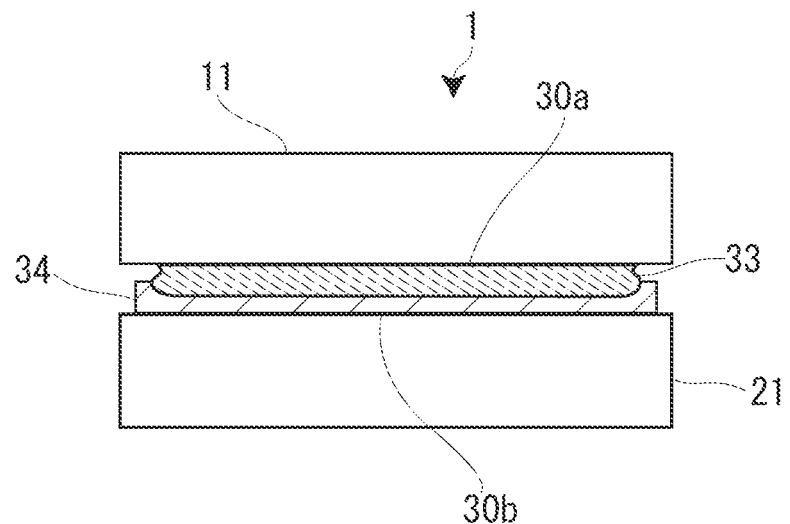

Referring to FIGS. 3A and 3B, a film formation arrangement (film formation pattern) of the aluminum containing layer 31 and the germanium layer 32 will be explained. FIGS. 3A and 3B are enlarged views of the A-A line cross section in FIG. 2. As illustrated in FIG. 3A, the aluminum containing layer 31 is evenly film-formed on the bonding section 30b of the CMOS chip 20 in a state before the eutectic bonding. Further, the germanium layer 32 on the aluminum containing layer 31 is film-formed such that an outer end 32a of the germanium layer 32 is receded inward with respect to an outer end 31a of the aluminum containing layer 31. While, any metal layer is not film-formed at all on the bonding section 30a of the MEMS chip 10 and a silicon surface of the substrate 11 is barely formed. From this state, an eutectic alloy layer 33 is formed between the substrates 11 and 21 by the bonding method described above as illustrated in FIG. 3B, and the MEMS chip 10 and the CMOS chip 20 are bonded by eutectic bonding. In the eutectic bonding of the embodiment, the pressurization and the heating is controlled appropriately, and a portion of the aluminum containing layer 31 which is not in contact with the germanium layer 32 remains without eutectic action (residual portion 34). In this case, the germanium layer 32 is preferably film-formed thinner than the aluminum containing layer 31 for the purpose of effective eutectic reaction.

Thus, in a case that a metal layer is not film-formed at the MEMS chip 10 side before the bonding, a film formation process can be simplified after forming the sensing section 12 and undesired effect such as deformation, adhesion and breakage by film formation on a movable structure of the sensing section 12 as a thin film can be avoided. Further, since the aluminum containing layer 31 utilizes aluminum wirings of the integrated circuit 22, metal film formation needed for actual bonding is only the germanium film formation on the bonding section 30b of the CMOS chip 20, thereby bonding process can be simplified. Still further, since the bonding section 30 is disposed to surround the sensing section 12 and the circuit central section 23 and the eutectic alloy layer 33 is formed in such a way as to be orthogonal in an inner/outer direction of the facing MEMS chip 10 and the CMOS chip 20, the MEMS chip 10 and the CMOS chip 20 can be bonded with high sealing characteristics and bonding strength. The aluminum containing layer 31 and the germanium layer 32 may be film formed on either bonding section of the MEMS chip 10 or of the CMOS chip 20, and they may be film-formed on a bonding section of a same substrate or on bonding sections of different substrates.

Further, since the germanium layer 32 is film-formed such that the outer end 32a of the germanium layer 32 is receded inward with respect to the outer end 31a of the aluminum containing layer 31, the formed eutectic alloy is formed without being pressed out from the bonding section 30 even if the eutectic alloy in the melting state expands to an outer side by pressurization at the time of bonding, thereby undesired conduction to an electrode can be avoided and productivity (an yield rate) of a device can be enhanced. Length from the outer end 31a of the aluminum containing layer 31 to the outer end 32a of the receded germanium layer 32 is preferably equal to or less than 20 μm.

Referring to FIGS. 4 to 5B, a weight ratio of the germanium layer 32 to the aluminum containing layer 31 at the time of bonding will be explained. In the bonding method of the embodiment, heating temperature and heating time as well as heating pressure is controlled for eutectic reaction between the whole germanium layer 32 and a part of the aluminum containing layer 31 in mutual bonding surfaces (see FIG. 3B). In practice, the weight ratio of the germanium layer 32 to the aluminum containing layer 31 is controlled by mainly a film thickness ratio of the germanium layer 32 to the aluminum containing layer 31. Therefore, the germanium layer 32 and the portion of the aluminum containing layer 31 in contact therewith directly react by eutectic reaction, and the residual portion of the aluminum containing layer 31 remains as it is (see FIG. 3B).

FIGS. 4 to 5B illustrate a test result of eutectic bonding in which film thickness of the germanium layer 32 is changed arbitrary while film thickness of the aluminum containing layer 31 is set fixedly (800 nm). FIG. 4 illustrates relationships among film thickness of the aluminum containing layer 31 and the germanium layer 32 film-formed before the eutectic bonding, a weight ratio of the germanium layer 32 to the aluminum containing layer 31, and a sealing ratio and shear strength (bonding strength) of the bonding section after the eutectic bonding. While, FIG. 5A is a graph of the weight ratio of the germanium layer 32 to the aluminum containing layer 31 versus the sealing ratio of the bonding section after the eutectic bonding, and FIG. 5B is a graph of the weight ratio of the germanium layer 32 to the aluminum containing layer 31 versus the shear strength (bonding strength) of the bonding section after the eutectic bonding.

As illustrated in FIG. 5A, when the weight ratio of the germanium layer 32 to the aluminum containing layer 31 is between 27 wt % and 57 wt %, the sealing ratio of the bonding section after the eutectic bonding is equal to or more than about 50%. Further, FIG. 5B illustrates that the bonding strength (shear strength) of the bonding section after the eutectic bonding is equal to or more than about 30 N when the weight ratio of the germanium layer 32 is between 27 wt % and 52 wt %. Still further, when the weight ratio of the germanium layer 32 is between 33 wt % and 42 wt %, the sealing ratio is 100% and the shear strength (bonding strength) is between 41.6 N and 56.3 N (see FIG. 4). In short, it becomes apparent by the test result that the bonding is performed with the highest sealing ratio and highest bonding strength when the eutectic bonding is performed by the method above with the weight ratio of the germanium layer 32 to the aluminum containing layer 31 as having 33 wt % to 42 wt %. This also indicates that good eutectic bonding can be obtained when the germanium layer 32 in the embodiment (film thickness of the aluminum containing layer 31=800 nm) is film-formed between 200 nm and 300 nm thickness (see FIG. 4).

Figure 6A:
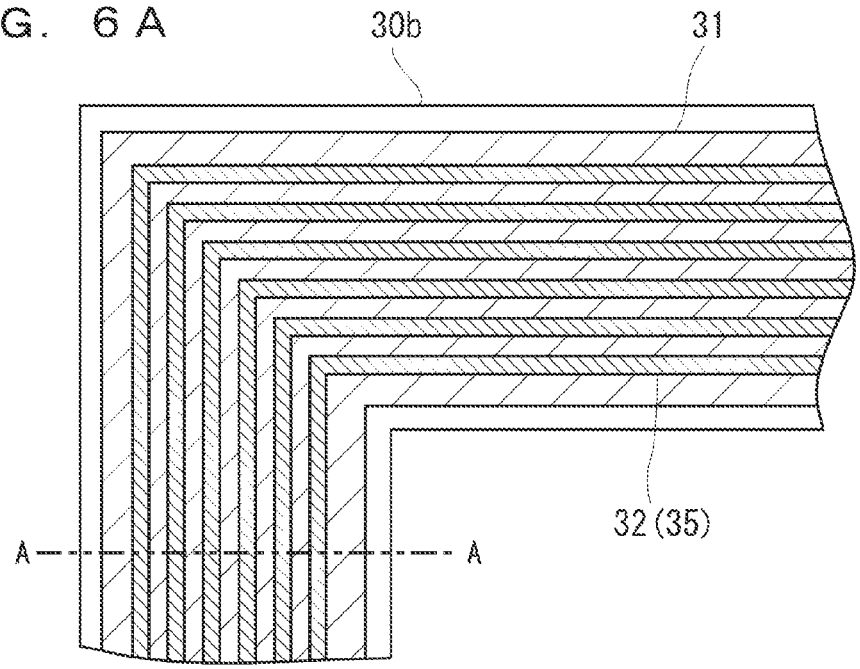
FIG. 6A is an elevation view and FIG. 6B is a cross sectional view illustrating film formation arrangement of the aluminum containing layer and the germanium layer according to a first modification of the embodiment.
Figure 6B:
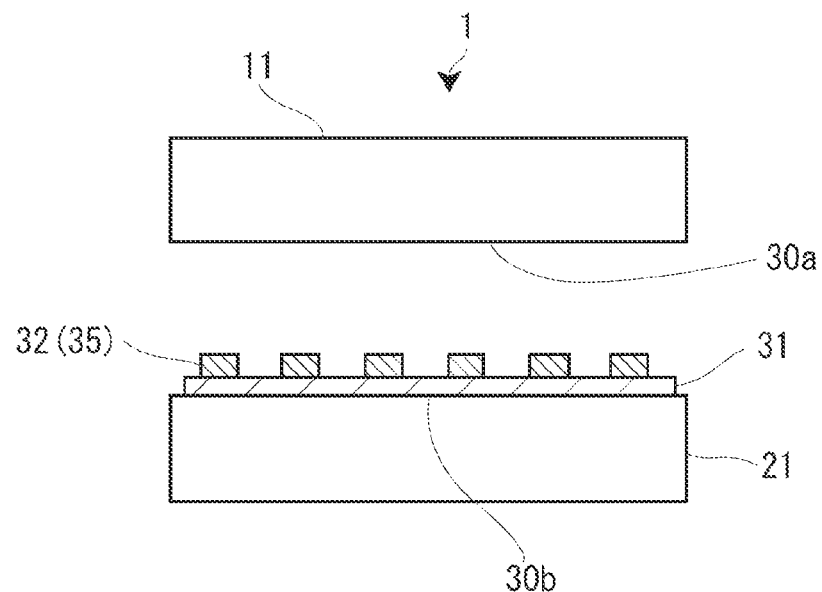

Referring to FIGS. 6A to 8B, a modification of the film formation arrangement of the aluminum containing layer 31 and the germanium layer 32 according to the embodiment will be explained. FIG. 6A illustrates a portion of the bonding section 30b of the CMOS chip 20 before the eutectic bonding, and FIG. 6B illustrates a cross section of the bonding section 30 before the eutectic bonding (a first modification). As illustrated, the aluminum containing layer 31 is evenly film-formed on the bonding section 30b of the CMOS chip 20 and the germanium layer 32 is film-formed on the aluminum containing layer 31 in a plurality of strips shape. In short, the germanium layer 32 is made up of a plurality of concentric strip layer sections 35 which have an identical shape.

In this kind of eutectic bonding, it has been known that the bonding strength is high at the end portion of the germanium layer 32. Therefore, as the modification above, a total area of the end portion in the germanium layer 32 (strip layer sections 35) can be increased by film-forming the germanium layer 32 as the strip layer sections 35, and strong eutectic bonding can be achieved without increasing an area of the bonding section 30. Further, since the plurality of strip-shaped germanium layers 32 are disposed to be orthogonal in the inner/outer direction of the bonding section 30, the MEMS chip 10 and the CMOS chip 20 can be bonded as having higher sealing characteristics and bonding strength.

Figure 7A:
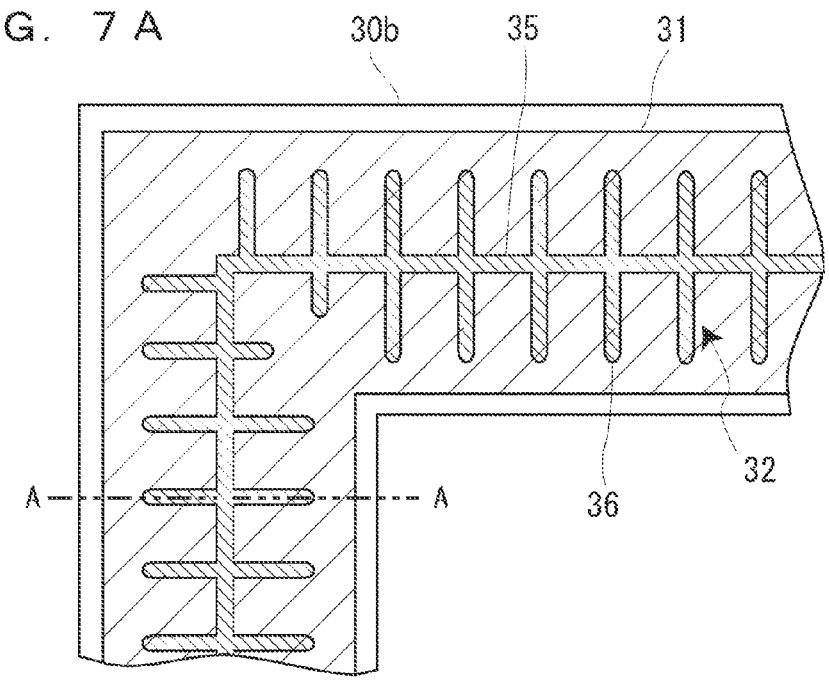
FIG. 7A is an elevation view and FIG. 7B is a cross sectional view illustrating film formation arrangement of the aluminum containing layer and the germanium layer according to a second modification of the embodiment.
Figure 7B:
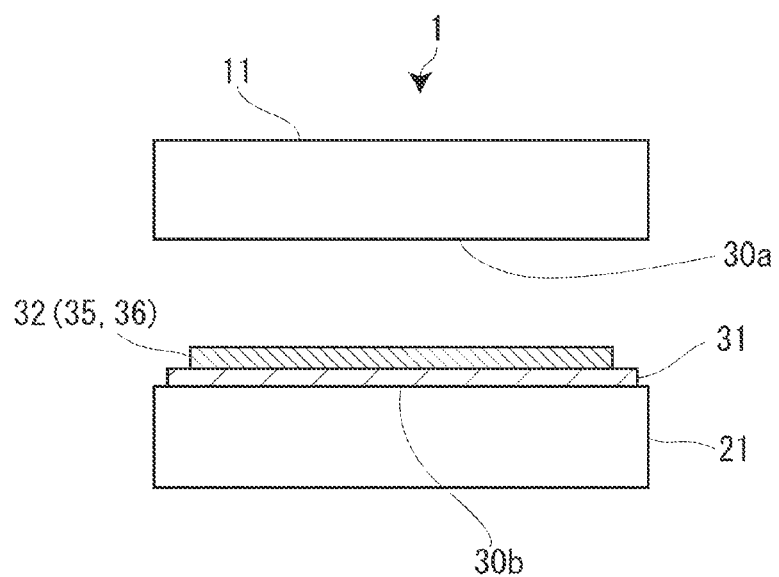

FIGS. 7A and 7B illustrate a second modification of the film formation arrangement of the aluminum containing layer 31 and the germanium layer 32 according to the embodiment. As illustrated, in the film formation arrangement of the second modification, as the first modification, the aluminum containing layer 31 is evenly film-formed on the bonding section 30 of the CMOS chip 20, and the germanium layer 32 film-formed on the aluminum containing layer 31 is integrally formed with a single strip layer section 35 and a plurality of branch layer sections 36. The strip layer section 35 is formed in a square ring-shape along the aluminum containing layer 31 at a center of the aluminum containing layer 31 in a width direction. While, the plurality of branch layer sections 36 are film-formed so as to branch from each section of the strip layer section 35 to both sides at aright angle. Thus, a total area of the end portion of the germanium layer 32 (strip layer section 35 and branch layer sections 36) can be increased by forming the plurality of branch layer sections 36 (germanium layer 32) in a branch shape (fish's bone shape), thereby strong eutectic bonding can be achieved.

Figure 8A:
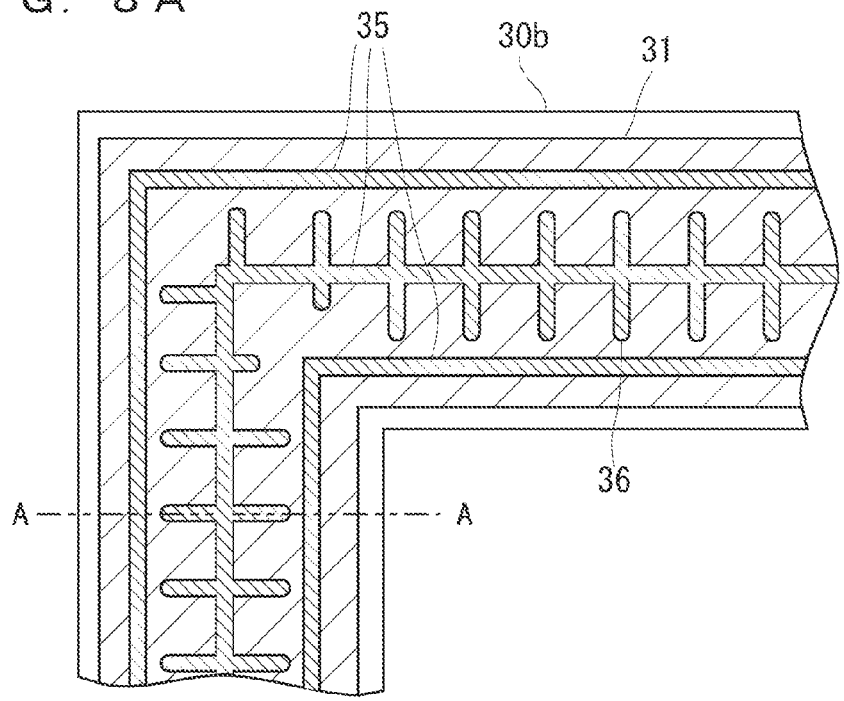
FIG. 8A is an elevation view and FIG. 8B is a cross sectional view illustrating film formation arrangement of the aluminum containing layer and the germanium layer according to a third modification of the embodiment.
Figure 8B:
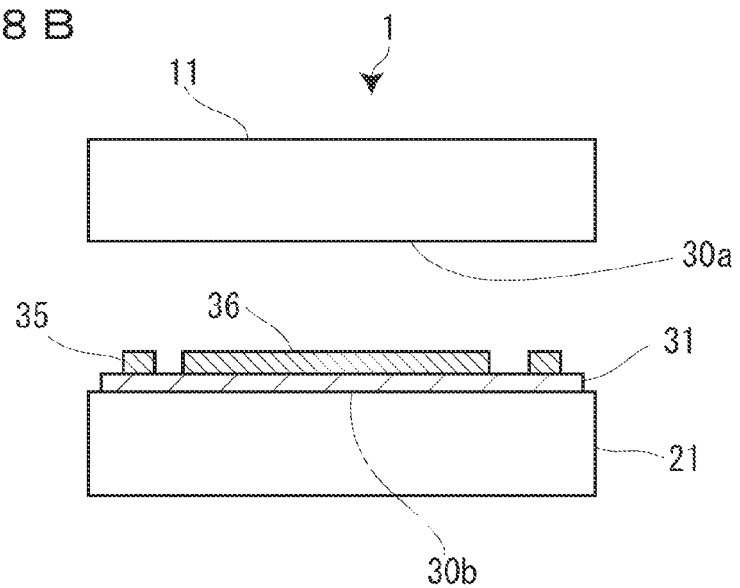

FIGS. 8A and 8B illustrate a third modification of the film formation arrangement of the aluminum containing layer 31 and the germanium layer 32. As illustrated, the film formation arrangement of the third modification has a configuration in which the first modification is combined with the second modification. In other words, in the third modification, the aluminum containing layer 31 is evenly film-formed on the bonding section 30b of the CMOS chip 20, and the germanium layer 32 film-formed on the aluminum containing layer 31 is made up of a plurality of strip layer sections 35 and a plurality of branch layer sections 36. More specifically, the germanium layer 32 is made up of concentric three strip layer sections 35 having an identical shape and the plurality of branch layer sections 36 which branch from each section of a centrally positioned strip layer section 35 to both side at a right angle. Thus, the MEMS chip 10 and the CMOS chip 20 can be bonded with higher sealing characteristics and bonding strength.

Referring to FIGS. 9A to 9C, the other embodiment (second embodiment) of the invention will be explained. Portions different from those of the above embodiment will be mainly explained and same numerals are labeled for similar elements. As illustrated in FIGS. 9A and 9B, the aluminum containing layer 31 film-formed on the bonding section 30b of the CMOS chip 20 is made up of a plurality of aluminum ring-shaped layer sections 37. The plurality of aluminum ring-shaped layer sections 37 are formed in a ring shape in a plan view concentrically with the bonding section 30b, and are disposed to be orthogonal in the inner/outer direction of the bonding section 30b. Further, a plurality of ring-shaped germanium layers 32 (germanium ring-shaped layer sections 38) are film-formed so as to fill in space of these aluminum ring-shaped layer sections 37. In this case, the plurality of germanium ring-shaped layer sections 38 are film-formed to contact contact-ends of the plurality of aluminum ring-shaped layer sections 37 in a vertical direction and to slightly overlap thereon (overlap layer sections 40) in a horizontal direction.

While, as illustrated in FIG. 9B, a plurality of engraved pits 41 are formed on the bonding section 30a of the substrate 11. The plurality of pits 41 are formed to correspond to positions (the overlap layer sections 40) where the plurality of germanium ring-shaped layer sections 38 overlap on the plurality of aluminum ring-shaped layer sections 38, and an alloy in a melting state after being heated and pressurized gets into the plurality of pits 41. The plurality of pits 41 may be newly formed on the substrate 11 after the sensing section 12 has been formed, or engraved portions formed in the formation process of the sensing section 12 may be used. Further, the pits 41 may have intermittent aperture shape or consecutive groove shape.

FIG. 9C illustrates the bonding section after eutectic bonding. A eutectic alloy in a melting state formed by heating spreads into the plurality of pits 41 thoroughly by capillary action in vacuum by pressurization. Then, the fixed eutectic alloy layer 33 is formed to bite into the bonding section 30 (substrate 11) of the MEMS chip 10. In other words, as illustrated, since the eutectic alloy layer 33 is formed vertically with respect to a surface direction of the bonding section, bonding with higher bonding strength can be achieved.

According to the structures, a semiconductor substrate can be bonded with high bonding strength and sealing characteristics at appropriate portions while adverse effect on the sensing section 12 is restrained. Further, such effective bonding enables the sensing section 12, the integrated circuit 22 and the external circuit to conduct electrically, and high precision MEMS devices in which the sensing section 12 and the circuit central section 23 are integrally packaged can be provided while an external atmosphere such as moisture, temperature, dust and the like is avoided.

In the embodiment, the silicon wafers formed with the sensing section 12 and the integrated circuit 22 controlling the sensing section is used, but structures formed in the silicon wafer may be any circuits, not being limited thereto. Still further, a semiconductor substrate (composite semiconductor) having other base material instead of silicon wafer formed by silicon may be used. It is preferable that either one of the bonded semiconductor substrates have aluminum wirings.

REFERENCE NUMERALS

1 MEMS device 10 MEMS chip 12 sensing section 11, 12 substrate 20 CMOS chip 22 integrated circuit 31 aluminum containing layer 31a, 32a outer end 32 germanium layer 35 strip layer section 36 branch layer section 41 pit

What is claimed is:

1. A method of bonding a semiconductor substrate, comprising:
    bonding a first semiconductor substrate with a second semiconductor substrate by eutectic bonding with pressurization and heating, an aluminum containing layer primarily made of aluminum and a germanium layer in an overlaid state being interposed between a bonding surface of the first semiconductor substrate and a bonding surface of the second semiconductor substrate;
    film-forming the aluminum containing layer on the bonding surface of the second semiconductor substrate and film-forming the germanium layer on the aluminum containing layer;
    receding an outer end of the germanium layer inward with respect to an outer end of the aluminum containing layer as to the aluminum containing layer and the germanium layer in the overlaid state; and
    broadening a pattern width of the aluminum containing layer than a pattern width of the germanium layer.

2. The method of bonding a semiconductor substrate according to claim 1, wherein heating temperature and heating time of the pressurization and heating is controlled for alloying the germanium layer and the aluminum containing layer by eutectic bonding except an outer end portion of the aluminum containing layer.

3. The method of bonding a semiconductor substrate according to claim 1, wherein the aluminum containing layer and the germanium layer are film-formed on either the first semiconductor substrate or the second semiconductor substrate.

4. The method of bonding a semiconductor substrate according to claim 3, wherein the aluminum containing layer is film-formed in a ring shape in planar view as having predetermined width, and the germanium layer has one or more strip layer sections film-formed in a ring shape in planar view on the aluminum containing layer.

5. The method of bonding a semiconductor substrate according to claim 3, wherein the aluminum containing layer is film-formed in a ring shape in planar view as having predetermined width, and the germanium layer has a strip layer section film-formed in a ring shape in planar view and a plurality of branch layer sections branched from the strip layer section on the aluminum containing layer.

6. The method of bonding a semiconductor substrate according to claim 3, wherein the aluminum containing layer and the germanium layer are film-formed on the second semiconductor substrate and a pit is formed in the bonding surface of the first semiconductor substrate, in which a eutectic alloy generated by the pressurization and heating fills.

7. A MEMS device bonded by the method of bonding a semiconductor substrate according to claim 1, wherein the first semiconductor substrate has a MEMS structure formed to be engraved at the bonding surface side thereof, and the second semiconductor substrate has an integrated circuit formed at the bonding surface side to control the MEMS structure.

8. The MEMS device according to claim 7, wherein the MEMS device is either one of an acceleration sensor, an angular velocity sensor, an infrared ray sensor, a pressure sensor, a magnetic sensor or a sonic sensor.

9. The method of bonding a semiconductor substrate according to claim 2, wherein the aluminum containing layer and the germanium layer are film-formed on either the first semiconductor substrate or the second semiconductor substrate.

10. The method of bonding a semiconductor substrate according to claim 9, wherein the aluminum containing layer is film-formed in a ring shape in planar view as having predetermined width, and the germanium layer has one or more strip layer sections film-formed in a ring shape in planar view on the aluminum containing layer.

11. The method of bonding a semiconductor substrate according to claim 9, wherein the aluminum containing layer is film-formed in a ring shape in planar view as having predetermined width, and the germanium layer has a strip layer section film-formed in a ring shape in planar view and a plurality of branch layer sections branched from the strip layer section on the aluminum containing layer.

12. The method of bonding a semiconductor substrate according to claim 9, wherein the aluminum containing layer and the germanium layer are film-formed on the second semiconductor substrate and a pit is formed in the bonding surface of the first semiconductor substrate, in which a eutectic alloy generated by the pressurization and heating fills.

13. The method of bonding a semiconductor substrate according to claim 4, wherein the aluminum containing layer and the germanium layer are film-formed on the second semiconductor substrate and a pit is formed in the bonding surface of the first semiconductor substrate, in which a eutectic alloy generated by the pressurization and heating fills.

14. The method of bonding a semiconductor substrate according to claim 5, wherein the aluminum containing layer and the germanium layer are film-formed on the second semiconductor substrate and a pit is formed in the bonding surface of the first semiconductor substrate, in which a eutectic alloy generated by the pressurization and heating fills.

15. The method of bonding a semiconductor substrate according to claim 1, wherein a the weight ratio of the germanium layer to the aluminum containing layer is between 27 wt % and 57 wt %, and a sealing ratio of a bonding section after the eutectic bonding is equal to or more than about 50%.

16. The method of bonding a semiconductor substrate according to claim 1, wherein a bonding strength of a bonding section after the eutectic bonding is equal to or more than about 30 N when a weight ratio of the germanium layer to the aluminum containing layer is between 27 wt % and 52 wt %.

17. The method of bonding a semiconductor substrate according to claim 1, wherein a weight ratio of the germanium layer to the aluminum containing layer is between 33 wt % and 42 wt %, a sealing ratio is 100% and a bonding strength is between 41.6 N and 56.3 N.

18. The method of bonding a semiconductor substrate according to claim 1, wherein a weight ratio of the germanium layer to the aluminum containing layer is between 33 wt % and 42 wt %.

19. The method of bonding a semiconductor substrate according to claim 1, wherein the aluminum containing layer has a thickness of 800 nm and the germanium layer has a thickness of 200 nm to 300 nm.

* * * * *